(12) United States Patent
Anderson et al.

(10) Patent No.: US 8,456,625 B2
(45) Date of Patent: *Jun. 4, 2013

(54) METHODS FOR REAL-TIME CONTAMINATION, ENVIRONMENTAL, OR PHYSICAL MONITORING OF A PHOTOMASK

(75) Inventors: Brent A. Anderson, Jericho, VT (US); Robert K. Leidy, Burlington, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 1343 days.

This patent is subject to a terminal disclaimer.

(21) Appl. No.: 12/182,668

(22) Filed: Jul. 30, 2008

(65) Prior Publication Data

US 2010/0029021 A1 Feb. 4, 2010

(51) Int. Cl.
*G01N 21/00* (2006.01)
*G06F 17/50* (2006.01)

(52) U.S. Cl.
USPC .......................... 356/237.4; 716/51

(58) Field of Classification Search
USPC ................ 356/237.4; 716/51, 139; 355/30, 355/75
See application file for complete search history.

(56) References Cited

U.S. PATENT DOCUMENTS

| | | | |
|---|---|---|---|
| 5,581,324 A | 12/1996 | Miyai et al. | |
| 6,312,859 B1 | 11/2001 | Taniguchi | |
| 6,509,956 B2 | 1/2003 | Kobayashi | |
| 6,570,508 B1 | 5/2003 | Kvenvold | |
| 6,653,024 B1 | 11/2003 | Shiraishi et al. | |
| 6,809,793 B1* | 10/2004 | Phan et al. | 355/30 |
| 6,813,004 B1 | 11/2004 | Horikoshi et al. | |
| 6,993,405 B2* | 1/2006 | Beaulieu et al. | 700/116 |
| 7,053,355 B2 | 5/2006 | Ye et al. | |
| 7,171,334 B2 | 1/2007 | Gassner | |
| 7,196,771 B2 | 3/2007 | Berger | |
| 7,233,874 B2 | 6/2007 | Ye et al. | |
| 7,270,012 B2 | 9/2007 | Yokoyama et al. | |
| 7,633,600 B2 | 12/2009 | Onvlee et al. | |
| 7,828,929 B2 | 11/2010 | Lee et al. | |
| 7,929,117 B2* | 4/2011 | Anderson et al. | 355/75 |
| 8,136,055 B2* | 3/2012 | Anderson et al. | 716/51 |
| 2007/0099099 A1 | 5/2007 | Onvlee et al. | |
| 2010/0029021 A1 | 2/2010 | Anderson et al. | |

FOREIGN PATENT DOCUMENTS

JP 2006133411 A 5/2006

OTHER PUBLICATIONS

Office Action issued in related U.S. Appl. No. 12/182,672 dated Sep. 16, 2011.
Office Action issued in related U.S. Appl. No. 12/182,672 dated May 17, 2011.
Notice of Allowance issued in related U.S. Appl. No. 12/056,047 dated Dec. 14, 2010.
Office Action issued in related U.S. Appl. No. 12/056,047 dated Aug. 20, 2010.

* cited by examiner

*Primary Examiner* — Gregory J Toatley
*Assistant Examiner* — Dominic J Bologna
(74) *Attorney, Agent, or Firm* — Wood, Herron & Evans LLP; Anthony J. Canale

(57) ABSTRACT

Methods for real-time contamination, environmental, or physical monitoring of a photomask. An attribute of a photomask is monitored using a sensor of an electronics package attached to the photomask. The methods further include generating one or more sensor signals relating to the monitored attribute with the sensor and transmitting the one or more sensor signals from the electronics package to a control system.

14 Claims, 2 Drawing Sheets

METHODS FOR REAL-TIME CONTAMINATION, ENVIRONMENTAL, OR PHYSICAL MONITORING OF A PHOTOMASK

BACKGROUND

The invention relates generally to integrated circuit fabrication and, in particular, to methods for real-time monitoring of an attribute of a photomask.

Semiconductor manufacturers fabricate integrated circuits using photolithographic processes that rely upon a series of different photomasks to define different structural features characteristic of the circuit. The pattern engrained on each photomask is designed to conform to dimensional rules that ensure that the patterns transfer properly and that the integrated circuit functions properly. Once the layout is created as a pattern on the photomask, the photolithographic process utilizes an exposure tool to project the mask pattern onto a photoresist layer carried on the semiconductor wafer.

Among other process variables, a satisfactory product yield is contingent upon having essentially defectless masks and reticles. Photomask deployment may result in relatively high mean time to detect (MTTD) for the appearance of new mask-related defects or the occurrence of mask degeneration. Poor handling of a photomask may dislodge otherwise innocuous particulates and cause relocation to positions on the photomask that ultimately cause defects in the wafers fabricated using the photomask. In any event, degradation of the photomask from contamination, as well as an abnormal environmental factor or events occurring during handling, may cause yield loss in the integrated circuits fabricated using the photomask.

As an important step associated with the photolithography process, wafer fabricators periodically inspect every photomask after a fixed number of wafer passes to determine the condition of the photomask. Unfortunately, high-resolution mask inspection tools, such as CCD imaging systems, are typically only found in mask fabrication shops. Because of the absence of a high-resolution mask inspection tool, wafer fabricators may have only a limited ability to monitor the photomask condition. In any event, conventional approaches for photomask inspection do not provide real-time monitoring of contamination on the photomask, the environment of the photomask, or a physical attribute of the photomask.

Accordingly, there is a need for improved methods to provide monitoring of a measurable contamination, environmental, or physical attribute of a photomask.

BRIEF SUMMARY

In an embodiment of the invention, a method of monitoring an attribute of a photomask includes monitoring the attribute with a sensor of an electronics package attached to the photomask. The method further includes generating one or more sensor signals relating to the monitored attribute with the sensor and transferring the sensor signals from the electronics package to a control system.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Embodiments of the invention relate to methods of monitoring a photomask with a sensor that is physically coupled with the photomask. The sensor is operative to monitor one or more attributes of the photomask or events that occur related to the photomask of the assembly. In particular, the sensor is configured to monitor or detect events related to the photomask in real-time as the photomask is used during a manufacturing process to manufacture an integrated circuit chip or while the photomask is in storage. The sensor can communicate over a wired connection, or wirelessly, with a lithography tool or system, a reticle holder, a reticle storage system, or another control system for the purpose of recording and responding to monitored events related to the photomask assembly. The frame of the pellicle may be used as antenna for wireless communications with the control system. In yet another embodiment, the sensor may include the capability of storing an identification number and communicating that identification number associated with the photomask to the control system for use in distinguishing among different photomasks.

Figure 1:
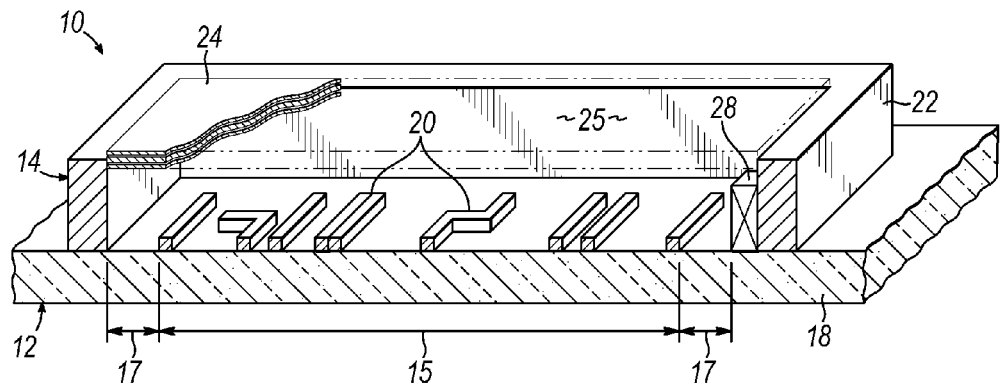
FIG. 1 is a side view of a photomask assembly including a pellicle, a photomask, and a sensor.

With reference to FIG. 1, a photomask assembly 10 is configured to be coupled with an optical aligner, such as a stepping projection aligner or stepper, and used in conjunction with a lithography tool 60 (FIG. 2) in a chip manufacturing line to generate a pattern in a photoresist layer applied to a wafer. To transfer the pattern to the photoresist layer, the photomask assembly 10 is suspended above the wafer and a flux of ultra-violet light, X-rays, or other type of electromagnetic radiation is directed from the lithography exposure system through the photomask assembly 10 and toward the wafer.

The photomask assembly 10 includes a photomask 12 and a pellicle 14. The photomask 12 includes a substantially flat substrate or plate 18 of a material like quartz or glass and a layer 20 of a material, such as chromium or chromium oxynitride, applied on one side. The layer 20 is etched, stopping on the plate 18, to impart a pattern of opaque and non-opaque regions on the plate 18. The opaque regions and non-opaque regions of layer 20 correspond to a pattern representing features in an integrated circuit design.

An image of the opaque and non-opaque regions in the metal layer 20 is projected onto a layer of photoresist carried on the semiconductor wafer by directing the electromagnetic radiation through the photomask 12 and toward the wafer. The photomask 12 includes an active area in the form of a mask field 15 containing the opaque and non-opaque regions that are imaged onto the photoresist layer of the wafer. The photomask 12 may incorporate a pattern large enough to pattern an entire wafer with each exposure or, alternatively, may function as a reticle containing a pattern for one or more die but not large enough to transfer a wafer-sized pattern in a single exposure.

Non-opaque regions transmit electromagnetic radiation of the wavelength used by the exposure system using the photomask 12 through the plate 18 un-attenuated. Opaque regions attenuate or completely block the electromagnetic radiation to a degree. The electromagnetic radiation exposes the photoresist with an image of the pattern of opaque and non-opaque regions. Alternatively, the photomask 12 may include regions of modulated thickness that effectively define the opaque and non-opaque regions that are imaged with phase shifting onto the photoresist layer.

The pellicle 14 is constructed of a pellicle frame 22 and a thin transparent film or membrane 24 secured peripherally to the frame 22. The photomask 12 further includes a non-active area in the form of an annular border 17 that is spatially located between the frame 22 of the pellicle 14 and the mask field 15. The annular border 17 is not imaged onto the photoresist layer on the wafer. The frame 22 is physically affixed or attached to the photomask 12 such that one surface of the transparent membrane 24 is held at a fixed distance from the confronting surface of the photomask 12. The frame 22, which is typically a continuous and unbroken ring, may be adhesively bonded to the periphery of the photomask 12 to affix the pellicle 14 to the photomask 12. The frame 22 may be a single-thickness wall composed of a hard plastic or, alternatively, a metal such as aluminum or an aluminum alloy. The transparent membrane 24 may be composed of an organic material, such as nitrocellulose or cellulose acetate, and may be fluoropolymer coated.

The pellicle 14 operates to isolate a self-contained, controlled environment consisting of an enclosed space 25 bordered or bounded spatially by the frame 22, the transparent membrane 24, and photomask 12. The attribute that is controlled within the controlled environment of the enclosed space 25 may comprise one or more of temperature, humidity, chemical composition of the atmosphere, air pressure, particulate count, or combinations of these attributes. The pellicle 14 primarily functions to shield the photomask 12 against contamination originating from the cleanroom environment. The image of any foreign matter or contamination collected on the transparent membrane 24 is not reproduced in the photosensitive resist layer residing on the wafer because the separation between the transparent membrane 24 and photomask 12 places any collected contamination at a location that, during exposure, is projected in an out of focus condition in the plane of the wafer.

In an alternative embodiment of the invention, the pellicle 14 may be omitted from the photomask 12. Certain types of photomasks 12 may not require the protection afforded by a pellicle 14, such as photomasks 12 that are used in conjunction with X-rays originating from the lithography exposure system.

Figure 2:
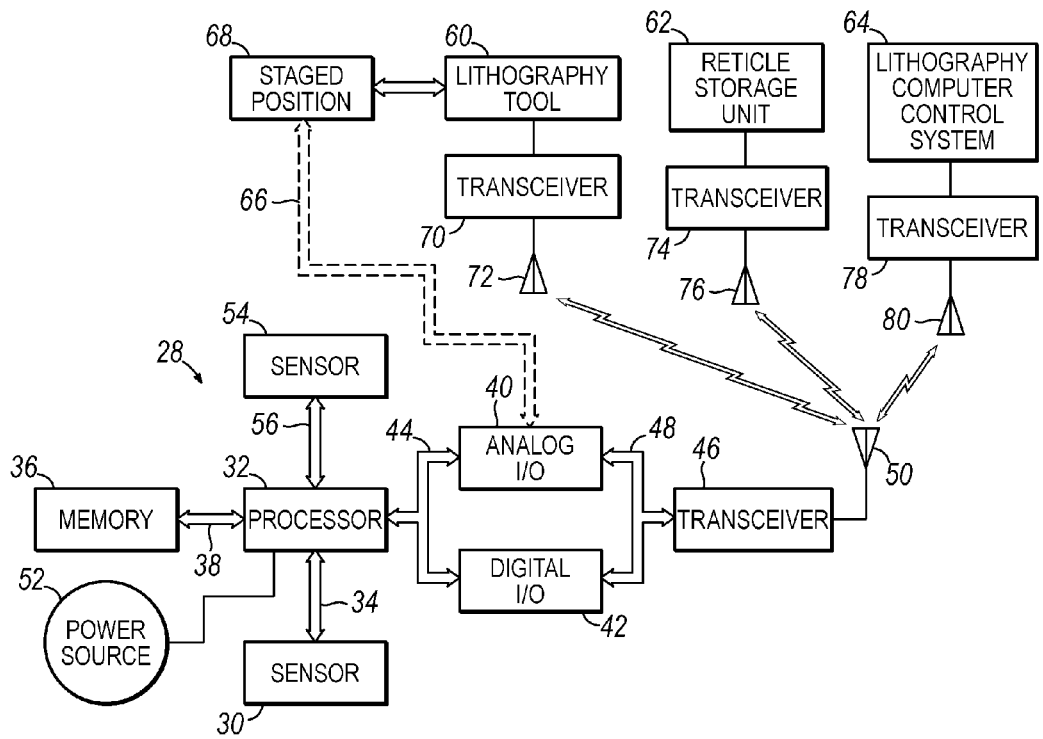
FIG. 2 is a diagrammatic view of a system including the photomask assembly of FIG. 1 in accordance with an embodiment of the invention.

With reference to FIGS. 1 and 2, the photomask assembly 10 further includes an electronics package 28 with a sensor 30, a processor 32, a bus 34 connecting the processor 32 to the sensor 30, a memory 36, and a bus 38 connecting the processor 32 to the memory 36. The electronics package 28 further includes an analog I/O circuit 40 and a digital I/O circuit 42 that are both connected to processor 32 by a bus 44. The electronics package 28 further includes a transceiver 46 that is connected by a bus 48 to the analog I/O circuit 40 and digital I/O circuit 42 and, thereby, by bus 44 with the processor 32. The processor 32 includes any circuitry required to operate the sensor 30 or additional circuitry may be included in the electronics package 28 but external to the processor 32. A portion of the circuitry may also be carried on board the sensor 30.

Transceiver 46 has an antenna 50 used by the electronics package 28 to transmit sensor readings to a lithography tool 60, a reticle storage system 62, or another control system 64.

The transceiver 46 may also rely on the antenna 50 to receive programming or control signals, such as power on, power off, schedule sensor operation, setup information, communicate sensor data, and poll, relating to modes of operation for the electronics package 28 communicated from the lithography tool 60, reticle storage system 62, or control system 64. In certain alternative embodiments, the transceiver 46 can be replaced with a different type of transmitter that lacks signal-receiving capabilities but, instead, is limited to sending signals. The sensor readings, as well as any programming or control signals, may be transmitted and received by the transceiver 46 according to any suitable encoding and modulating scheme. In one embodiment, the antenna 50 may comprise the frame 22 of the pellicle 14, which is an existing physical structure of the photomask assembly 10, so that an additional discrete antenna structure is not required. The connection between the pellicle frame 22 and the analog I/O circuit 40 and digital I/O circuit 42 are established in a manner understood by a person having ordinary skill in the art. In an alternative embodiment, the transceiver 46 may be omitted in its entirety, and replaced by a wired connection with the lithography tool 60, reticle storage system 62, or control system 64. For example, a wired connection 66 may be established between a staged position 68 inside the lithography tool 60 and the analog I/O circuit 40 of the electronics package 28.

The electronics package 28 is powered by a power source 52, which may be a rechargeable and/or replaceable battery. In other embodiments, the power source 52 may be solar cell that is stationed in the electronics package 28 and positioned relative to the pellicle 14 at a location that is illuminated by the electromagnetic energy directed through the photomask 12. Such power sources 52 have conventional constructions understood by a person having ordinary skill in the art.

The electronics package 28 and, therefore, the sensor 30 are physically coupled with the photomask 12, the pellicle 14, or both by, for example, one or more adhesive bonds. In the representative embodiment, the electronics package 28 is directly physically attached to the photomask 12 at a location inside the perimeter established by the frame 22 of the pellicle 14 and within the enclosed space 25. However, the electronics package 28 is located in the annular border 17 of the photomask 12 such that the electronics package 28 does not occlude the transmission of electromagnetic energy through the mask field 15 of the photomask 12. In other words, the electronics package 28 has a footprint on the photomask 12 that is confined within the annular border 17. In an alternative embodiment, the electronics package 28 may have a direct, physically coupling with the frame 22 of the pellicle 14, instead of the photomask 12, such that the frame 22 is an intervening structure that facilitates an indirect, physical coupling between the electronics package 28 and the photomask 12.

The sensor 30 may have a construction, as understood by a person having ordinary skill in the art, imparting the capability of detecting one or more contamination, environmental, or physical events or attributes related to the photomask 12 in real-time as the photomask 12 is used during a manufacturing process to manufacture an integrated circuit chip. The real-time monitored attributes or events monitored by sensor 30 may include, but are not limited to, the presence of chemical contamination in the atmosphere inside the enclosed space 25, the temperature of the atmosphere inside the enclosed space 25, a temperature of the photomask 12, a humidity inside the enclosed space 25, accelerations, shocks, or vibrations experienced by the photomask 12 during handling and storage, an optical flux through the photomask 12, electrostatic discharge (ESD) events or environment such as ambient electrical fields experienced by the photomask 12, the presence of foreign material or particulates inside the enclosed space 25, and air pressure inside the enclosed space 25.

If the pellicle 14 is omitted from the construction, then monitored attribute is not necessarily tied to the enclosed space 25 as the environment is not closed. In this instance, the sensor 30 may sense the presence of chemical contamination in the ambient environment near the photomask 12, a temperature of the ambient environment near the photomask 12, a temperature of the photomask 12, a humidity of the ambient environment near the photomask 12, accelerations, shocks, or vibrations experienced by the photomask 12 during handling or storage, an optical flux through the photomask 12, electrostatic discharge (ESD) events or environment such as electrical fields experienced by the photomask 12, the presence of foreign material or particulates in the vicinity of the photomask 12, and the air pressure of the ambient environment near the photomask 12.

In one embodiment, the sensor 30 may be a chemical transducer configured to sense the presence of elemental gases like oxygen, hydrogen, or chlorine, ammonia, water, hydrogen fluoride, hydrogen chloride, nitrogen oxides, silanes, alcohols, ketones, esters, amines, solvents, chlorinated solvents, or fluoridated solvents. In addition to presence, the sensor 30 may be capable of monitoring the concentration of one or more chemical contaminants sensed in the ambient environment. In another embodiment, the sensor 30 may be a thermistor or thermocouple capable of outputting a signal from which temperature readings can be deduced and temperature changes can be detected. For example, the detected temperature changes may be used for temperature control of the environment of the photomask 12. In yet other embodiments, the sensor 30 may comprise an accelerometer configured for measuring accelerations, shocks, or vibrations of the photomask 12 imparted during handling or storage, a humidity transducer configured for monitoring relative humidity, or a pressure transducer for sensing the pressure level of the gases in the surrounding atmosphere. In yet another embodiment, the sensor 30 may comprise a photoelectric type particulate sensor or an ionization type particulate sensor that is configured to monitor for the presence of particulates or other foreign matter.

The sensor 30 generates sensor data representing the measured attribute. The electronics package 28 may continuously transfer the sensor data in real time to the lithography tool 60, reticle storage system 62, or control system 64. Alternatively, the electronics package 28 may transfer sensor data intermittently or periodically to the lithography tool 60, reticle storage system 62, or control system 64. Alternatively, the electronics package 28 may transfer stored sensor data to the lithography tool 60, reticle storage system 62, or control system 64 only when polled by one of these external sources.

Upon receipt, the lithography tool 60, reticle storage system 62, or control system 64 either evaluates the sensor data, stores the sensor data for future evaluation, or transfers the sensor data to another computer for evaluation. For example, use or inspection decisions may be keyed off the sensor data. The processing system is further configured to identify an out-of-tolerance event from the sensor data and, in response to the out-of-tolerance event, and perform one or more of the following; flag the photomask for an quality control inspection, communicate to lithography tool to stop production, store a flag that indicates mask needs an inspection, or communicate to the lithography tool to modify monitoring conditions.

With renewed reference to FIG. 2 and in accordance with an alternative embodiment, the electronics package 28 may include another sensor 54 that is similar in function and construction to sensor 30. A bus 56 connects the sensor 54 with the processor 32. In one embodiment, sensor 54 may be configured to monitor a different attribute related to the photomask 12 than sensor 30. Furthermore, sensor 54 may be integrated into an additional electronics package (not shown) like electronics package 28 but separate from electronics package 28 and coupled with the photomask 12. As may be appreciated, more than two sensors may be incorporated into the electronics package 28 and, in one embodiment, each of these sensors may be configured to sense different attributes of the photomask 12. Additional sensors, such as sensor 54, function to increase the event and attribute monitoring capability of the electronics package 28. Sensor 54 may communicate sensor data at a different frequency than the sensor 30 or may be instructed to communicate sensor data at a different time than sensor 30.

The lithography tool 60 includes the optical aligner and a source of the flux of ultra-violet light, X-rays, or other type of electromagnetic radiation that is directed from an exposure system of the lithography tool 60 through the photomask assembly 10 and toward the photoresist on the wafer. The lithography tool 60 may locally store a small number of photomask assemblies each similar or identical to photomask assembly 10. Of this small number of photomask assemblies, one of the photomask assemblies is typically installed in a manufacturing position and the rest of the photomask assemblies are stored for future installation as part of a manufacturing sequence. The reticle storage system 62 is an automated storage cabinet that includes a trackable set of locations used to store multiple photomask assemblies each similar or identical to photomask assembly 10. The reticle storage system 62 is intended for relatively long term storage of the photomask assembly 10.

The lithography tool 60 has a transceiver 70 equipped with an antenna 72 that is used to communicate with the transceiver 46 of the electronics package 28 via antenna 50. Similarly, the reticle storage system 62 has a transceiver 74 equipped with an antenna 76 that is used to communicate with the transceiver 46 of the electronics package 28 via antenna 50. The control system 64, which may be also has a transceiver 78 equipped with an antenna 80 that is used to communicate with the transceiver 46 of the electronics package 28 via antenna 50.

At any instant in time, the electronics package 28 may bi-directionally or uni-directionally communicate with either the lithography tool 60, the reticle storage system 62, or the control system 64. However, under certain circumstances, the electronics package 28 may concurrently or intermittently talk with two or all of these partners. In addition to receiving a continuous or intermittent stream of sensor readings from the electronics package 28, the lithography tool 60, reticle storage system 62, or control system 64 may communicate programming or control signals, such as power on, power off, schedule sensor operation, communicate sensor data, and poll to prompt the transfer of sensor data, as commands to the electronics package 28.

In an alternative embodiment, the transceiver 46 may be omitted in its entirety, and replaced by a wired connection 66 with, for example, the lithography tool 60. For example, the wired connection 66 may be established between a staged position 68 of the lithography tool 60 and the analog I/O circuit 40. At the staged position 68, temporary electrical connections are established between an interface at the staged position and the analog I/O circuit 40 and/or the digital I/O circuit 42. The staged position 68 may be a manufacturing location in the lithography tool 60 or another location at which the photomask assembly 10 is temporarily stored while awaiting transfer to the manufacturing location.

In an alternative embodiment, the electronics package 28 may include another sensor 54 that is similar in function and construction to sensor 30. A bus 56 connects the sensor 54 with the processor 32. In one embodiment, sensor 54 may be configured to monitor a different attribute related to the photomask 12 than sensor 30. Furthermore, sensor 54 may be integrated into an additional electronics package (not shown) like electronics package 28 but separate from electronics package 28 and coupled with the photomask 12. As may be appreciated, more than two sensors may be incorporated into the electronics package 28 and, in one embodiment, each of these sensors may be configured to sense different attributes of the photomask 12. Additional sensors, such as sensor 54, function to increase the event and attribute monitoring capability of the electronics package 28. Sensor 54 may communicate sensor data at a different frequency than the sensor 30 or may be instructed to communicate sensor data at a different time than sensor 30.

Figure 3:
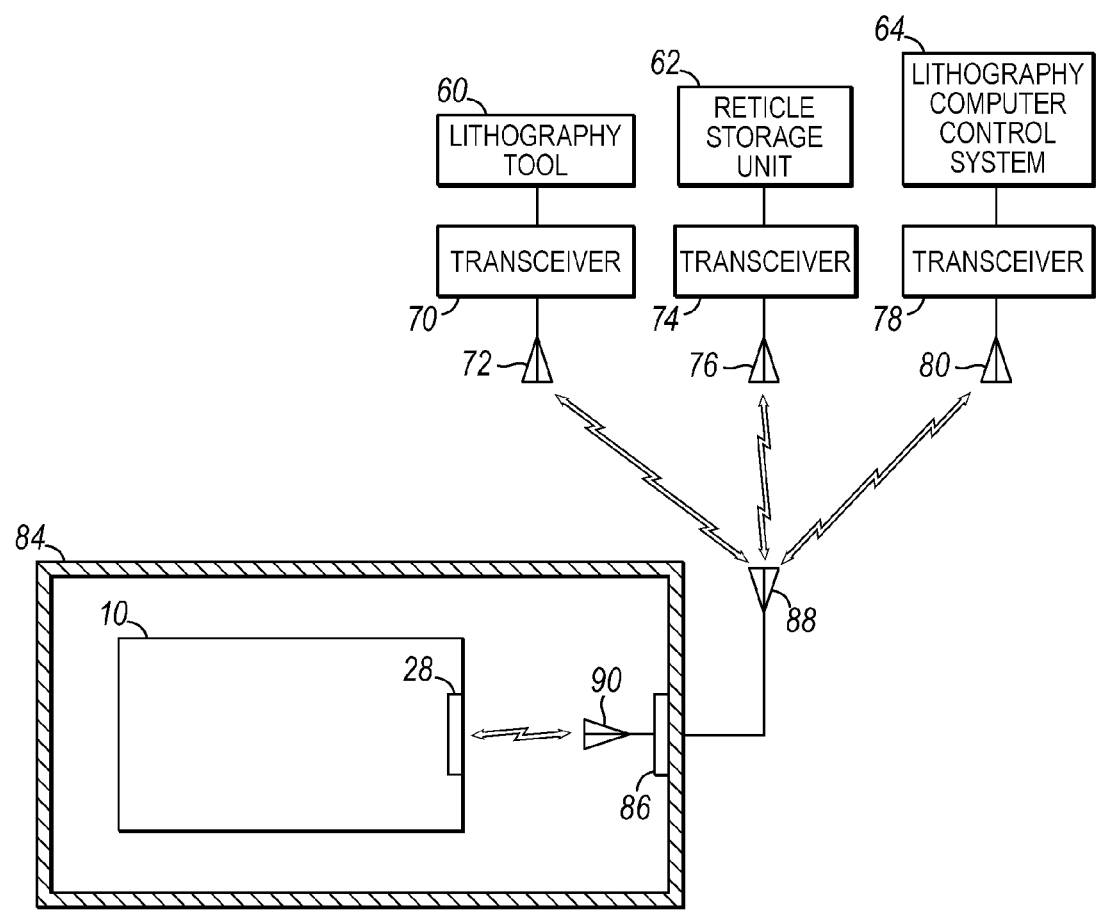
FIG. 3 is a diagrammatic view of a system including the photomask assembly of FIG. 1 in accordance with an alternative embodiment of the invention.

With reference to FIG. 3 in which like reference numerals refer to like features in FIGS. 1 and 2 and in accordance with an alternative embodiment of the invention, the electronics package 28 may also communicate with a transceiver 86 associated with a mask holder 84. The transceiver 86 acts as an intermediary that relays sensor data from the electronics package 28 to the lithography tool 60, reticle storage system 62, or control system 64, as well as relaying signals from the lithography tool 60, reticle storage system 62, or control system 64 to the electronics package 28. The transceiver 86 of the mask holder 84 also includes an antenna 88 exterior of the physical enclosure for the photomask 10 defined by the mask holder 84 and an antenna 90 within the physical enclosure for the photomask 10 defined by the mask holder 84. The transceiver 86 relies on the antenna 90 to receive signals from the transceiver 46 of the electronics package 28, as well as forward any commands received from the lithography tool 60, reticle storage system 62, or other control system 64. The transceiver 86 uses the antenna 88 to send the signals received from the electronics package 28 to the lithography tool 60, reticle storage system 62, or other control system 64, as well as to receive any commands originating from these sources.

It will be understood that when an element is described as being "attached", "connected", or "coupled" to another element, it can be directly connected or coupled to the other element or intervening elements may be present. In contrast, when an element is described as being "directly attached", "directly connected", or "directly coupled" to another element, there are no intervening elements present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Furthermore, to the extent that the terms "includes", "having", "has", "with", "composed of", or variants thereof are used in either the detailed description or the claims, such terms are intended to be inclusive in a manner similar to the term "comprising."

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of monitoring an attribute of a photomask, the method comprising:
   monitoring the attribute with a sensor of an electronics package attached to the photomask;
   generating one or more sensor signals relating to the monitored attribute with the sensor;
   communicating the sensor signals to a transceiver of the electronics package;
   wirelessly transmitting sensor data representing the sensor signals using a frame of a pellicle coupled with the photomask as an antenna from the transceiver of the electronics package to a control system; and
   analyzing the sensor signals represented by the sensor data at the control system.

2. The method of claim 1 further comprising:
   communicating one or more command signals from the control system to the transceiver of the electronics package.

3. The method of claim 2 further comprising:
   controlling operation of the electronics package and the sensor using the command signals.

4. The method of claim 1 further comprising:
   storing the sensor signals in a memory of the electronics package; and
   intermittently transferring the sensor signals from the electronics package to the control system.

5. The method of claim 4 further comprising:
   sending a request from the control system to the electronics package to initiate the transfer of the sensor signals.

6. The method of claim 1 wherein the attribute monitored with the sensor is chemical contamination, temperature, humidity, acceleration, shock, vibration, optical flux, electrostatic discharge events, particulates, or air pressure.

7. The method of claim 1 wherein analyzing the sensor signals represented by the sensor data at the control system further comprises:
   identifying an out-of-tolerance event from the sensor signals; and
   in response to the out-of-tolerance event, flagging the photomask at the control system for a quality control inspection.

8. The method of claim 1 wherein analyzing the sensor signals represented by the sensor data at the control system further comprises:
   identifying an out-of-tolerance event from the sensor signals; and
   in response to the out-of-tolerance event, communicating an instruction from the control system to a lithography tool to stop production.

9. The method of claim 1 wherein analyzing the sensor signals represented by the sensor data at the control system further comprises:

identifying an out-of-tolerance event from the sensor signals; and in response to the out-of-tolerance event, storing a flag at the control system that indicates that the photomask needs an inspection.

10. The method of claim 1 wherein analyzing the sensor signals represented by the sensor data at the control system further comprises:

identifying an out-of-tolerance event from the sensor data; and in response to the out-of-tolerance event, communicating from the control system to a lithography tool to modify monitoring conditions.

11. The method of claim 1 wherein analyzing the sensor signals represented by the sensor data at the control system further comprising:

storing the sensor signals at the control system for use in analyzing trends in the sensor signals.

12. The method of claim 1 further comprising:

monitoring another attribute of the photomask with another sensor of the electronics package.

13. The method of claim 1 wherein the pellicle includes a transparent membrane connected by the frame with the photomask to define an enclosed space isolated from an ambient environment, and monitoring the attribute with the sensor of the electronics package attached to the photomask comprises:

monitoring a property of the ambient environment within the enclosed space as the monitored attribute.

14. The method of claim 13 wherein the attribute is chemical contamination inside the enclosed space, a temperature of an atmosphere inside the enclosed space, a temperature of the photomask, humidity inside the enclosed space, particulates inside the enclosed space, or pressure inside the enclosed space.

* * * * *